United States Patent [19]
Shimogama

[11] Patent Number: 5,889,786
[45] Date of Patent: Mar. 30, 1999

[54] MEMORY TESTING DEVICE

[75] Inventor: Kazushige Shimogama, Gyoda, Japan

[73] Assignee: Advantest Corporation, Tokyo, Japan

[21] Appl. No.: 942,727

[22] Filed: Oct. 2, 1997

[30] Foreign Application Priority Data

Oct. 3, 1996 [JP] Japan .................................. 8-263145

[51] Int. Cl.$^6$ .................................................. G06F 11/00
[52] U.S. Cl. ........................................................ 371/21.3
[58] Field of Search .................................. 371/21.3, 21.2, 371/21.1, 21.4, 21.5; 365/201, 159

[56] References Cited

U.S. PATENT DOCUMENTS

| | | | |
|---|---|---|---|
| 5,809,336 | 9/1998 | Moore et al. | 395/500 |
| 5,815,512 | 9/1998 | Osawa et al. | 371/22 |

*Primary Examiner*—Vincent P. Canney
*Attorney, Agent, or Firm*—Staas & Halsey

[57] ABSTRACT

In a memory testing device of a construction wherein various pieces of pattern data output from a pattern generator are taken out in a desired order and converted into a test pattern signal having a real waveform for application to each pin of a memory under test, the pattern selector provided for each I/O pin of the memory under test comprises plural registers having stored therein pattern selection control signals that designate patterns to be selected, a first multiplexer for selecting that one of the registers designated by a register selection control signal PJ generated by the pattern generator, and a second multiplexer that is controlled by the pattern selection control signal selected by the first multiplexer to select a pattern from the pattern data output from the pattern generator.

3 Claims, 7 Drawing Sheets

| PIN / CYCLE | I/O-1 | I/O-2 | I/O-3 | I/O-4 | I/O-5 | I/O-6 | I/O-7 | I/O-8 | SIGNAL |
|---|---|---|---|---|---|---|---|---|---|
| 1 | C0 | C1 | C2 | C3 | C4 | C5 | C6 | C7 | COMMAND |
| 2 | A0 | A1 | A2 | A3 | A4 | A5 | A6 | A7 | COLUMN ADDRESS |
| 3 | A8 | A9 | A10 | A11 | A12 | A13 | A14 | A15 | NAND ADDRESS |
| 4 | A16 | A17 | A18 | A19 | A20 | A21 | / | / | BLOCK ADDRESS |
| 5 | D0 | D1 | D2 | D3 | D4 | D5 | D6 | D7 | DATA $DAT_1$ |

MEMORY TESTING DEVICE

BACKGROUND OF THE INVENTION

The present invention relates to a memory testing device for large-capacity semiconductor memories such as those called flash memories.

Figure 1:
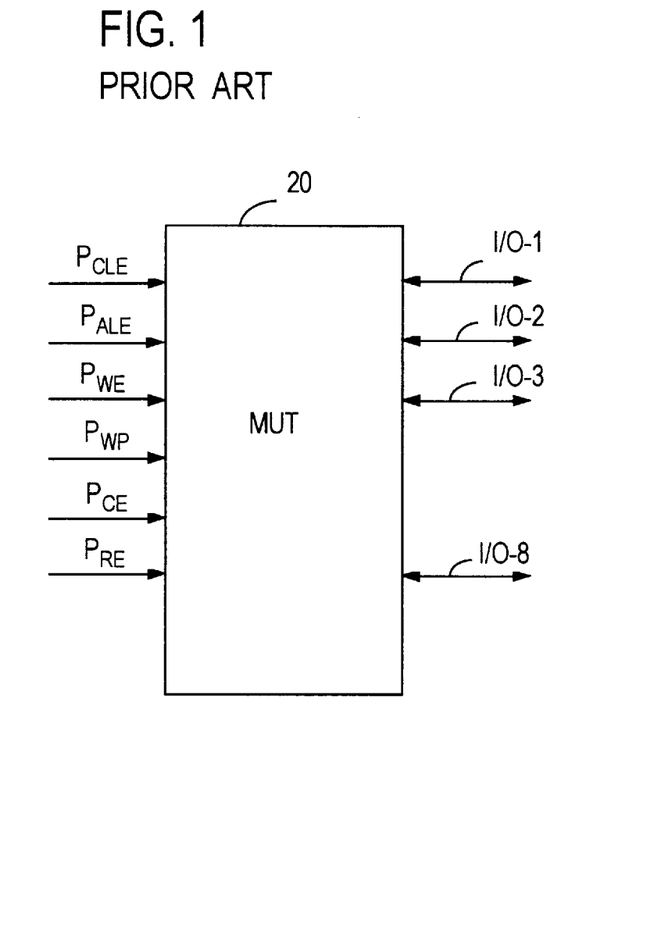
FIG. 1 is a diagram for explaining a memory that is tested by the memory testing device according to the present invention.

As one possible solution to the problem of increased number of pins with the growth in memory capacity, there is now proposed a memory that uses I/O pins both as primarily intended data input/output pins and as command input pins, address input pins and so forth. As shown in FIG. 1, such a memory has, in addition to, for example, eight input/output pins I/O-1 to I/O-8, a command input control pin $P_{CLE}$, an address input control pin $P_{ALE}$, a write control pin $P_{WE}$, a write inhibit control pin $P_{WP}$, a chip selection control pin $P_{CE}$ and a read control pin $P_{RE}$.

An address signal of a total of 8×3=24 bits can be input into the memory by applying it to the eight input/output pins I/O-1 to I/O-8 over three cycle periods, for instance. With the 24-bit address signal, it is possible to access a memory area having a storage capacity of 16 Mbits or so. Furthermore, an address signal of 8×4=32 bits can be input by applying it to the input/output pins over four cycle periods—this means that a memory area of an about 4-Gbit storage capacity can be accessed.

By time sharing the same pins and inputting thereinto an address signal over plural cycle periods as mentioned above, the memory capacity can be enlarged without increasing the number of pins. Hence, it is possible to construct memories of the same package structure but having different storage capacities.

Figure 2:
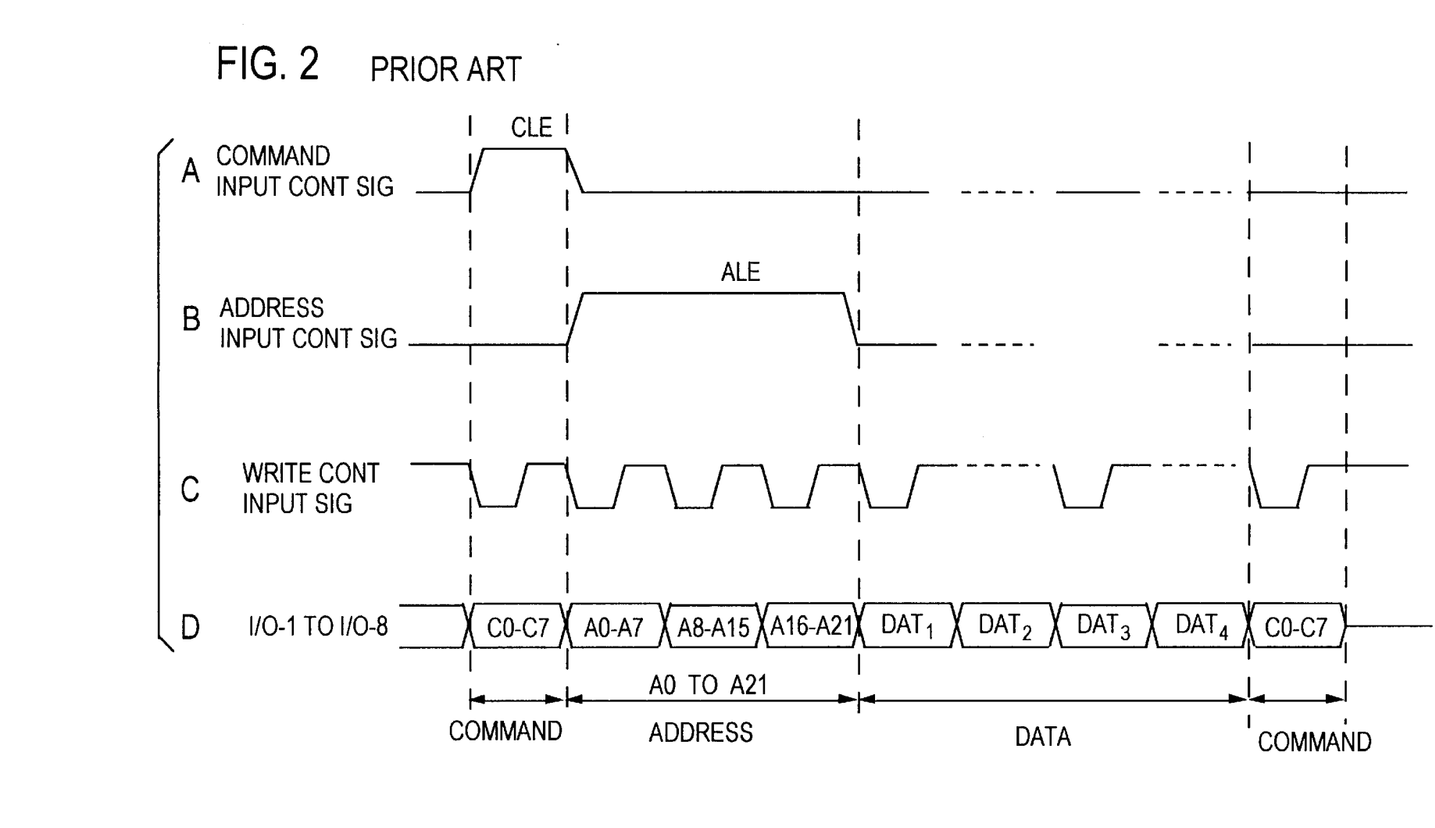
FIG. 2 is a waveform diagram for explaining the operation of the memory depicted in FIG. 1.

FIG. 2 shows an example of operation timing of this kind of memory. Row D shows a sequence of signals that are applied to the input/output pins I/O-1 to I/O-8. This signal sequence is headed by a command signal C0 to C7, which is followed by an address signal A0 to A21 and by data DAT.

To input the command signal C0 to C7, the address signal A0 to A21 and the data DAT into the memory in distinction from one another, the command input control pin $P_{CLE}$ and the address input control pin $P_{ALE}$ are provided. By making H-logic a command input control signal CLE for input to the command input control pin $P_{CLE}$ as shown in Row D, the command signal C0 to C7 is read into the memory. When an address input control signal ALE for input to the address input control pin $P_{ALE}$ is held H-logic as shown in Row B, signals applied to the input/output pins I/O-1 to I/O-7 are read as the address signal A0 to A21 into the memory, by which an access is made to an address desired to write data or address to read out data. FIG. 2 shows the cases where the 22-bit address signal A0 to A21 is supplied for three cycle periods to access a memory of a 4-Mbyte storage capacity and where the data $DAT_1$ to $DAT_n$ is applied to the input/output pins I/O-1 to I/O-8 on a time sharing basis to write the data into the memory.

Figure 3:
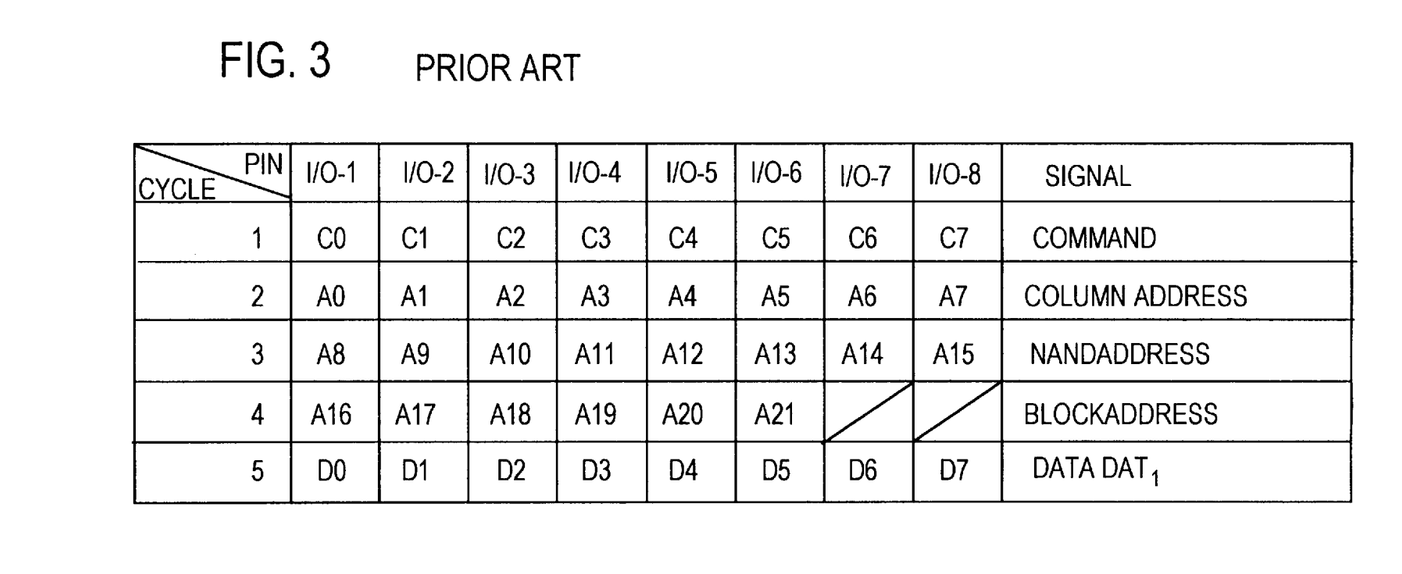
FIG. 3 is a diagram for explaining in detail signals that are applied to respective pins of the memory shown in FIG. 1.

FIG. 3 shows in detail examples of signals that are applied to the input/output terminals I/O-1 to I/O-8. In cycle 1 eight bits of the command signal C0 to C7 is applied to the input/output pins I/O-1 to I/O-7. In cycle 2 the first eight bits A0 to A7 of the address signal are provided. This address signal will hereinafter be referred to as a column address signal (or X address). In cycle 3 eight bits A8 to A15 of the address signal are provided. The address signal will hereinafter be referred to as a NAND address signal (or Y address). In cycle 4 six bits A16 to A21 of the address signal are provided. This address signal will hereinafter be referred to as a block address (or Z address). The address signal A0 to A21 is followed by respective bits D0 to D7 forming the data $DAT_1$.

As described above, in the case of a memory of the type using the input/output pins both as data input/output pins and as input pins such as address input pins and command input pins, it is necessary to supply different kinds of signals to each of the input/output pins I/O-1 to I/O-8 as shown in FIG. 3. This is a requirement that a memory testing device for this kind of memories is also required to meet; namely, to test this kind of memories, a command signal, an address signal and data need to be input to input/output pins I/O-1 to I/O-8.

Figure 4:
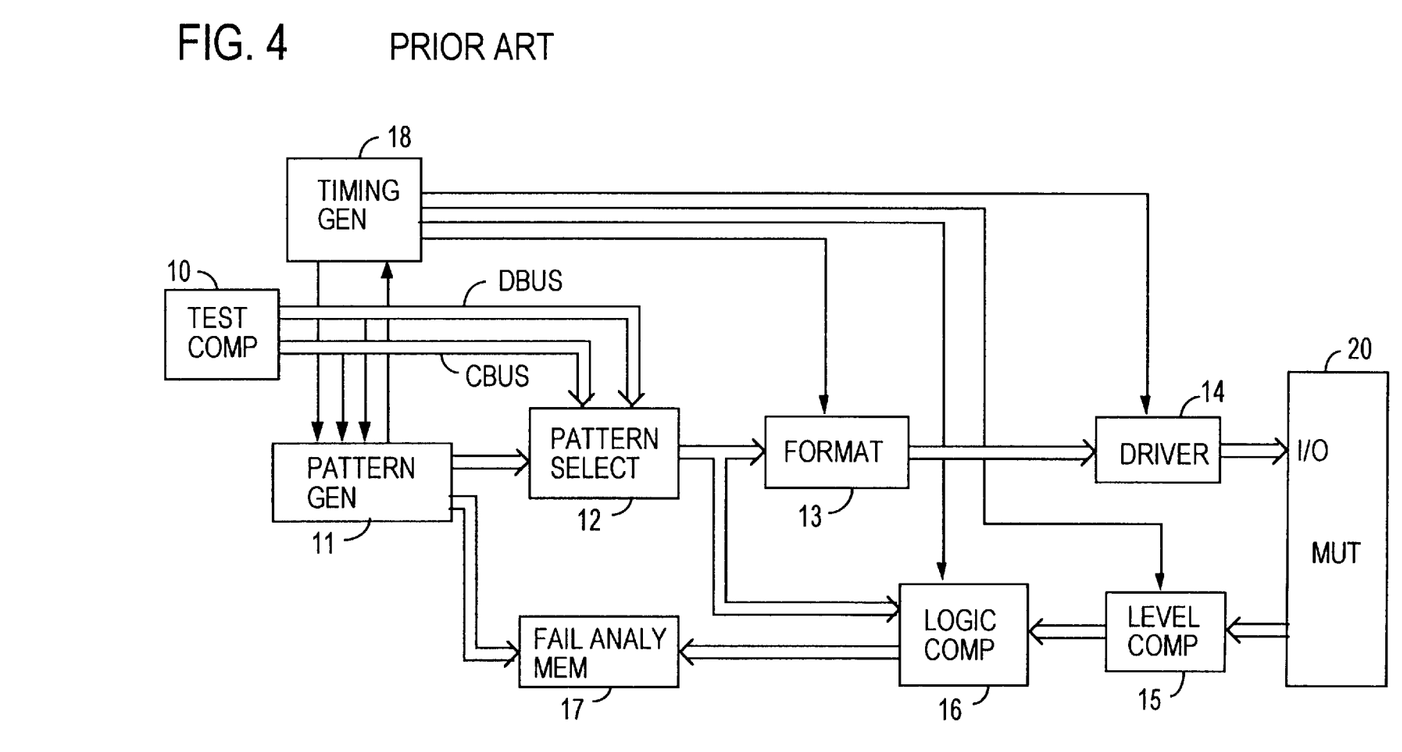
FIG. 4 is a block diagram for explaining the general configuration of a conventional memory testing device.

As depicted in FIG. 4, the memory testing device is basically made up of: a pattern generator 11; pattern select means 12 that selects various kinds of pattern signals output from the pattern generator 11 to take out pattern data to be provided to each pin; a formatter 13 for converting the pattern data, taken out by the pattern select means 12, to a pattern signal having a real waveform; a driver 14 for applying the pattern signal, generated by the formatter 13, to a memory under test MUT; a level comparator 15 that decides and takes in the logical level of a signal read out of the memory MUT; a logical comparator 16 for comparing the logical level, decided by the level comparator 15, with expectation data; a failure analysis memory 17 which, when a mismatch is detected by the logical comparator 16, that is, when a defective cell is detected in the memory MUT, stores at the address of the defective cell a logical value indicating its defectiveness and reads out and uses the stored value for a failure analysis; a timing signal generator 18 for applying timing signals to the pattern generator 11, the pattern select means 12, the formatter 13, the driver 14, the level comparator 15 and the logical comparator 16; and a tester processor 10 that governs the whole memory testing device.

In FIG. 3, the pattern selector 12, the formatter 13, the driver 14 and the level comparator 15 are each represented by one block, but in practice, each block has channels of the same number as that of pins of the memory MUT so that the pattern signal is fed to each pin.

Conventionally, a control signal that is provided under the control of a program in the tester processor 10 is applied via a data bus DBUS and a control bus CBUS to the pattern selector 12, which selects the pattern signal to be applied to each pin of the memory MUT. Hence, in the case of selecting different kinds of signals such as the command signal, the address signal and the data for each of the input/output pins I/O-1 to I/O-8 as described above, the contents of the program in the tester processor 10 is complex and the preparation of such a program requires much labor and complicated work, and hence it is highly expensive. This will be described below.

In the tester processor 10 there is provided a bus register 10R, in which a pin condition PD of the memory under test is set. The pin condition for the pins I/O-1 to I/O-8 is described, for example, as follows:

PD1–8=IN1,XOR,ACLK1,BCLK1,CCLK1,SDM,RDSM<X0–7, Y0–7,D0–7>

IN1 sets the pins I/O-1 to I/O-8 in an input mode, XOR, ACLK1, BCLK1 and CCLK1 designate waveform combining logic and the kind of clock for use in the formatter 13, SDM designates the generation of the Y address for two successive cycles and RDSM designates the kind of data. <X0–7,Y0–7,D0–7> designates the kind of pattern (X address, Y address, data) that is applied to the pins I/O-1 to I/O-8. Since the present invention is related particularly to the kind of pattern mentioned last, the pin condition will hereinafter be expressed merely as PD=<A,B,C,D> That is, in the case of the memory MUT in the example of FIG. 1, a description of a pin condition PD1–8 on the pins I/O-1 . . . , I/O-8 as PD1–8=<X0–7,Y0–7,C0–7,D0–7>, for example, indicates that when the X address is provided to the memory MUT, addresses X0, . . . , X7 are fed to the pins I/O-1, . . . , I/O-8, respectively, and that when the Y address is provided to the memory MUT, addresses Y0, . . . , Y7 are fed to the pins I/O-1, . . . , I/O-8, respectively. The same goes for the cases of commands C0, . . . , C7 and data D0, . . . , D7 are provided to the memory MUT.

In the conventional memory testing device, the description of the pin condition is limited to only three kinds of information because of restrictions on the hardware structure of the device. However, to test recent flash memories of large address sizes, it is necessary to apply the command c, the X address, the Y address, the Z address and the data D to the I/O pins I/O-1 to I/O-8 in a desired sequence as referred to previously with reference to FIG. 2. To meet this requirement, in the prior art, PD1–8=<T0–7,Z0–7,C0–7, D0–7>, for instance, is set as the pin condition in the bus register and prior to the generation of the Y address, for example, in a program for the pattern generation by the pattern generator (an instruction sequence), a multiplexer is controlled to generate the X address X0–7 of one cycle by interruption as described later on. This will be described below with reference to FIG. 5.

Figure 5:
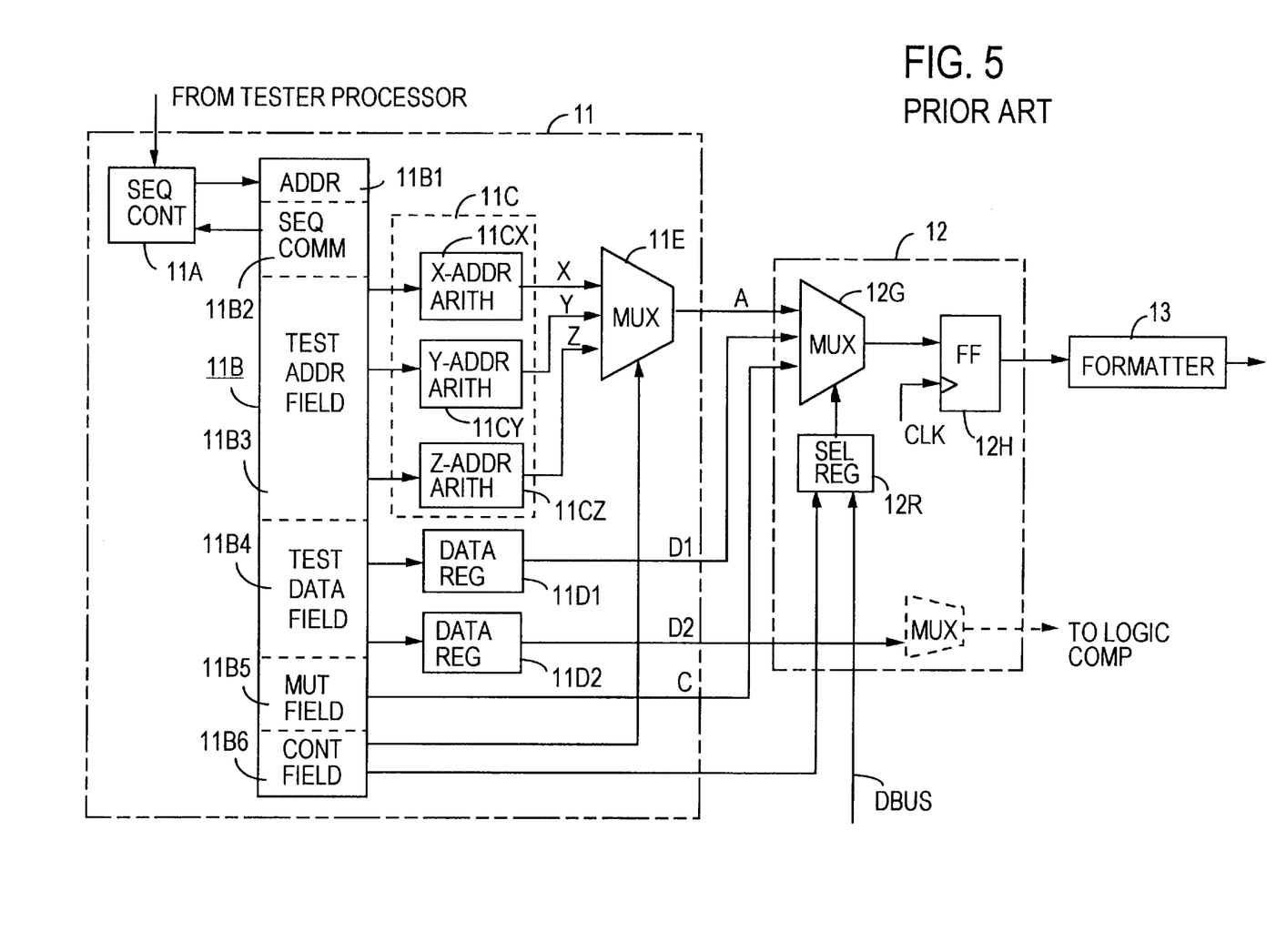
FIG. 5 is a block diagram showing the configurations of a pattern generator and a pattern selector in the prior art example of FIG. 4.

FIG. 5 shows, in simplified form, the pattern generator 11 in the conventional memory testing device of FIG. 4 and the formatter 13 provided corresponding to one I/O pin of the MUT. A sequence controller 11A of the pattern generator 11 provides an address of an instruction memory 11B, where an instruction to be executed is described, to an instruction address field 11B1 and generates the next address, following a sequence instruction described at that address. When the address is provided to the instruction address field 11B1 of the instruction memory 11B, instructions/data described in a sequence instruction field 11B2, a test address field 11B3, a test data field 11B4, an MUT field 11B5 and a control field 11B6 corresponding to that address are read out and the instructions are executed, by which data is set. As the result of this, sequence control instructions (INC, NOP, JUMP, etc.) for proceeding to an instruction address to be executed next, described in the sequence instruction field 11B2, are provided to the sequence controller 11A, then addresses in X-, Y- and Z-address calculators 11CX, 11CY and 11CZ of an calculation part 11C are calculated following a calculation instruction in the test address field 11B3, then data in the test data field 11B4 are output to data registers 11D1 and 11D2, then a MUT control signal C in the MUT field 11B5 is output, and selection control signals for a multiplexer 11E and the pattern selector 12 in the control field 11B6 are output. In this way, the pattern generator 11 generates, more than 100 kinds of patterns that are bit sequences of respective pattern data of an address pattern (22 bits, for example,) a data pattern (32 bits, for instance), a command pattern (8 bits, for instance) and so forth, and all the patterns are provided to the pattern selector 12 corresponding to each pin of the MUT.

In FIG. 5 there is shown only one pattern selector 12, but it is provided corresponding to each pin of the MUT. Each pattern selector 12 selects and outputs test patterns of address, data and command that are provided to the corresponding pin of the MUT via the formatter 13 and the driver 14. As indicated by the broken line, the pattern selector 12 also selects and outputs respective bits of expectation data set in the data register 11D2 for logical comparison with data read out of the MUT, but since this is not directly related to the present invention, no description will be given.

A multiplexer 12G of each pattern selector 12 determines which pattern is to be currently applied to the corresponding I/O pin, the X address, Y address, Z address, command C or data D, and which one of the eight I/O pins the pattern selector 12 corresponds to, based on a select signal (X, Y, Z, C, or D) from the control field 11B6 written in a register 12R and the pin condition PD provided from a path register 10R.

Conventionally, the address size of the memory under test is small, for example, 16-bit or less, so that in the case of inputting the address via the pin I/O-1 to I/O-8, for instance, a two-cycle address write (i.e. a write of the X address X0, . . . ,X7 and a write of the Y address Y0, . . . ,Y7) is enough; hence, the pin condition that is preset in the path register 10R needs only to be four kinds of data such as PD=<X0–7, Y0–7,C0–7,D0–7>. However, some of recent flash memories have address sizes larger than 16 bits, in which case the two-cycle address write is not enough to store all address bits. Therefore, the conventional testing device cannot be used to test such large-capacity memories. To settle this problem, it is necessary in the prior art that the description of the pin condition in the bus register set, for example, PD=<Y0–7,Z0–7,C0–7,D0–7>, about four kinds of data as mentioned above and that an instruction step to be stored in the instruction memory 11B be described so that the pattern generator 11 causes an interruption of one cycle for each Y address generating step and controls its multiplexer 11E (see FIG. 5) with the interruption cycle to select and output the X address. Hence, the preparation of the instruction program for the pattern generation is time-consuming accordingly.

SUMMARY OF THE INVENTION

It is therefore an object of the present invention to provide a memory testing device that permits the generation of test patterns for memories of large address sized without introducing complexity in the instruction program for selectively applying a command signal, an address signal and data to each input/output terminal.

The memory testing device according to the present invention, which tests a memory by applying a pattern to its plural input/output pins, comprises:

a pattern generator for generating pattern data of each of address, data and command signals and a register selection control signal;

a pattern selector for selecting a piece of pattern data corresponding to each input/output pin of the memory under test, from the pattern data output from the pattern generator;

a formatter for converting the pattern data selected by the pattern selector into a pattern of a desired real waveform; and a driver for applying the pattern from the formatter to the input/output pin corresponding thereto;

the pattern selector comprising:

plural pattern selection control signal registers provided corresponding to at least the kinds of the signals, for storing a pattern selection control signal to select the pattern data that is output from the pattern generator;

a control signal select multiplexer responsive to the register selection control signal from the pattern generator to select and output one pattern selection control signals from the pattern selection control signal registers; and a pattern select multiplexer responsive to the selected pattern selection control signal to select the pattern data from the pattern generator and provide it to the formatter.

DETAILED DESCRIPTION OF THE PREFERRED EMBODIMENTS

Figure 6:
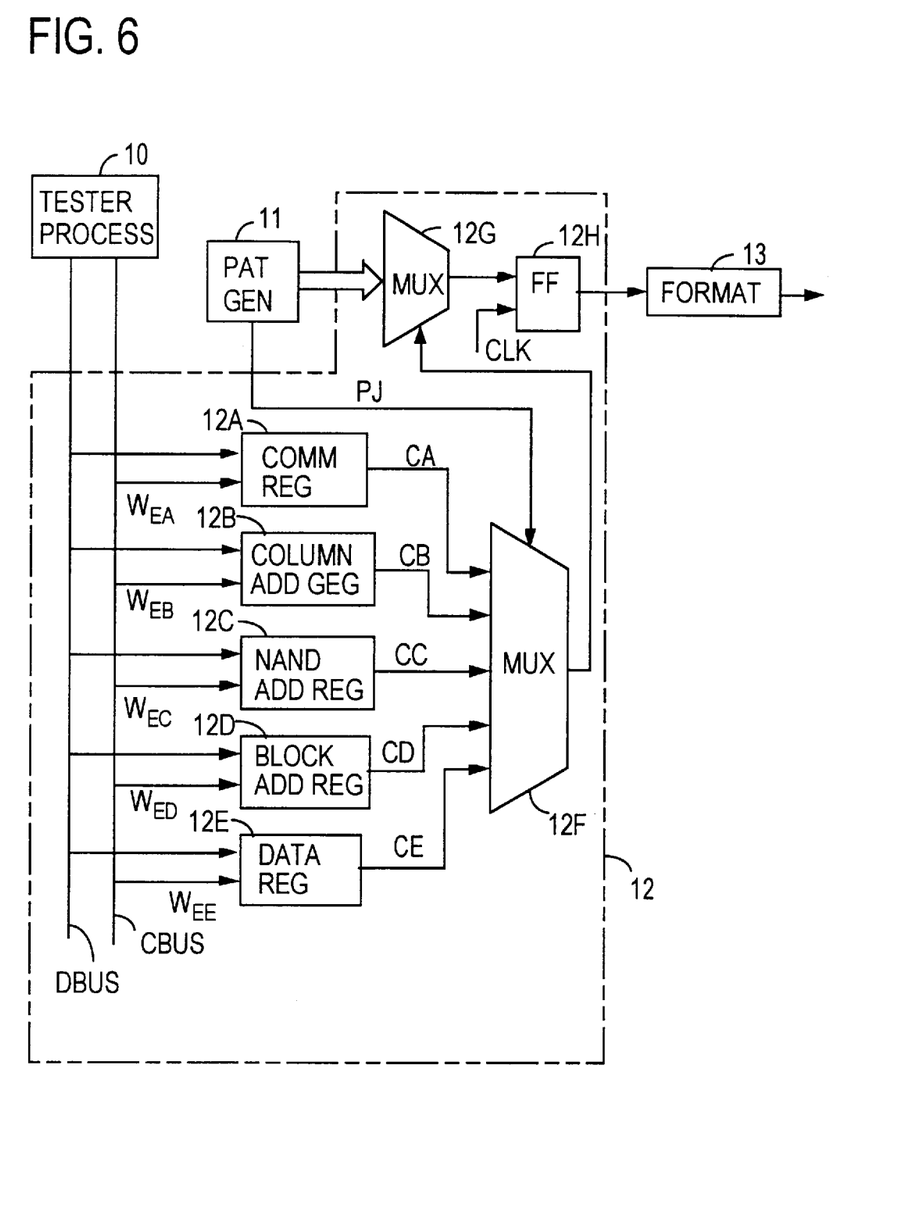
FIG. 6 is a block diagram for explaining the configuration of the principal part of the present invention.
Figure 7:
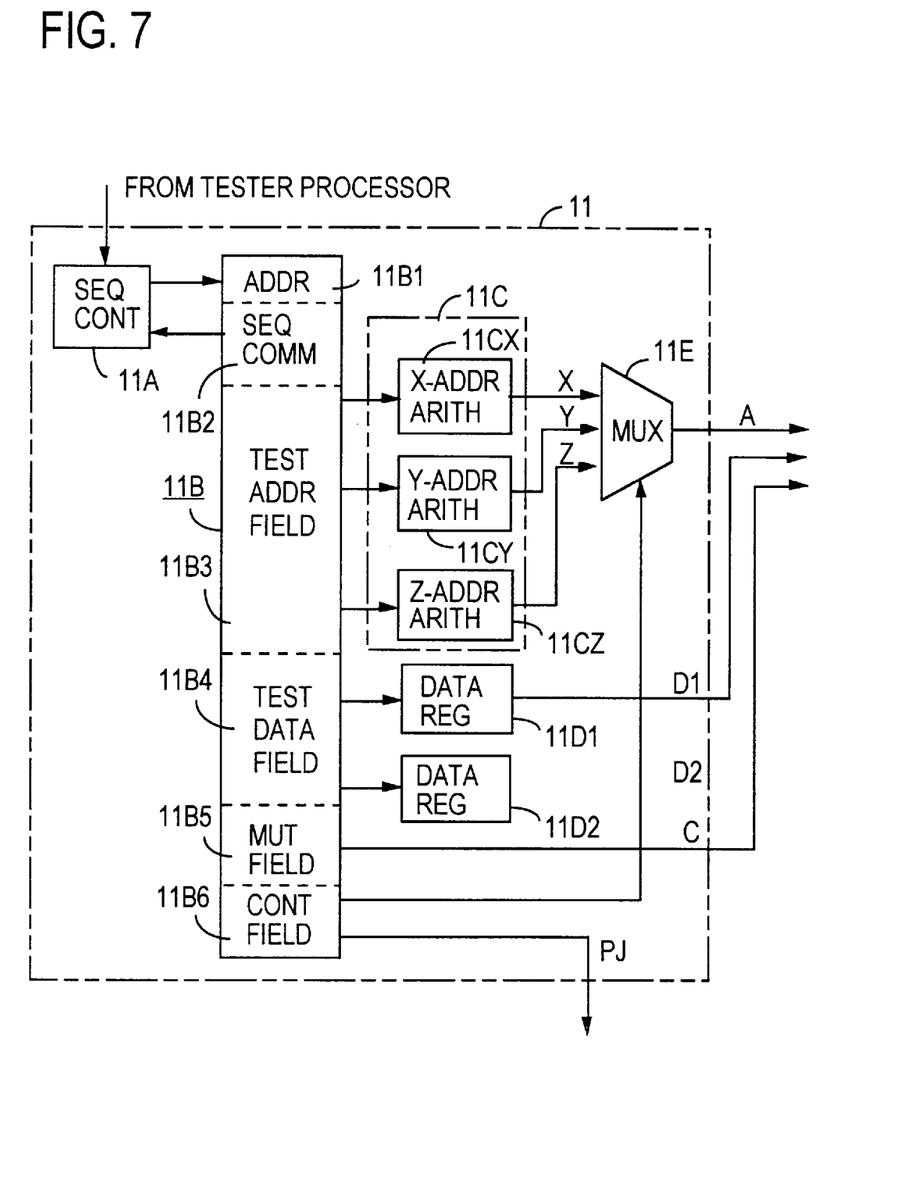
FIG. 7 is a block diagram showing the construction of a pattern generator 11 in FIG. 6.

In FIG. 6 there is illustrated in block form an embodiment of the present invention. Reference numeral 11 denotes a pattern generator and 12 a pattern selector. As shown in FIG. 7, the configuration itself of the pattern generator 11 is identical with the conventional configuration depicted in FIG. 5. According to the present invention, however, the multiplexer 12G of the pattern selector 12 is not controlled by the control signal written in the control field 11B6 of the instruction memory 1B, but instead a multiplexer 12F, which selects plural registers 12A to 12E provided in the pattern selector 12, is controlled by a control signal PJ written in the control field 11B6 as described later on and a pattern selection control signal stored in the selected register is used to control the pattern selection by the pattern selector 12. In the present invention, the pattern selector 12 is made up of plural registers 12a, 12B, 12C, 12D and 12E, multiplexers 12F and 12G and a flip-flop 12H. The number of registers 12A to 12E needs only to be the same as the number of kinds of the signal that are applied to the common input/output pins I/O-1 to I/O-8, but since the number of kinds of signals may sometimes differ with the kinds of memories under test, it is desirable to provide the registers of a number corresponding to the largest number of kinds of signals used.

That is, the register 12A is used as a command register, 12B as a column address register, 12C as a NAND address register, 12D as a block address register and 12E as a data register. A control signal CA for reading out a command signal, a control signal CB for reading out a column address, a control signal CC for reading out a NAND address, a control signal CD for reading out a block address and a control signal CE for reading out data are written in the registers 12A to 12E, respectively, from the tester processor 10 via the data bus DBUS. This write is effected by write command signals $W_{EA}$, $W_{EB}$, $W_{EC}$, $W_{ED}$ and $W_{EE}$ that are sent over the control bus CBUS.

The pattern selection control signals CA to CE written in the registers 12A to 12E are read out therefrom and applied to input terminals A, B, C, ..., E of the multiplexer 12F. In the instruction memory 11B of the pattern generator 11 there are described a sequence of instructions for pattern generation and in the control field 11B6 (see FIG. 7) of the memory there are described control signals PJ for designating the signals to be selected by the multiplexer 12F. The multiplexer 12F is controlled to be switched in the order in which its input terminals A, B, C, D and E are designated by the control signals PJ sequentially output from the control field 11B6 of the instruction memory 11B.

The pattern selection control signals CA, CB, CC, CD and CE are selected by the switching control of the multiplexer 12F and fed to a control terminal of the multiplexer 12G. The multiplexer 12G is controlled by these control signals CA to CE so that it extracts from a number of pattern signals output from the pattern generator 11 a piece of bit pattern data corresponding to the command signals C0, ..., C7 in response to the control signal CA, a piece of bit pattern data corresponding to the X address X0, ..., X7 in response to the control signal CB, a piece of bit pattern data corresponding to the Y address Y0, ..., Y7 in response to the control signal CC, a piece of bit pattern data corresponding to the Z address Z0, ..., Z7 in response to the control signal CD, and a piece of bit pattern data corresponding to the data D0, ..., D7 to be written into the memory MUT in response to the control signal CE. These pieces of pattern data are retimed by a clock CLK in the flip-flop 12H and fed to the formatter 13, wherein they are converted into real waveforms. Though not shown in FIG. 6, the real waveforms are provided via the driver to corresponding pins of the memory MUT as in the case of FIG. 4. Such pattern selectors 12, made up of the registers 12A to 12E, the multiplexers 12$f$ and 12G and the retiming flip flop 12H, are each provided corresponding to one of the pins of the memory under test MUT; that is, the pattern selectors 12 of the same number as that of pins of the memory are provided. And the pattern selection control signals CA to CE for extracting the command signal, the column address (X address), the NAND address (Y address), the block address (Z address) and the data, which are provided to each pin of the memory under test, are prestored in the registers 12A to 12E of each pattern selector 12. Accordingly, no matter which pins of the memory IC may be used as input/output pins, it is necessary only to read out of the registers 12A to 12E the control signals CA to CE for extracting the command signal, the column address signal, the NAND address signal, the block address signal and the data corresponding to each input/output pin; hence, there is no necessity for setting the pin condition in the bus register of the tester processor 10. Furthermore, the preparation of the instruction program is simple and easy because the control signals PJ, which is to be generated together with the series of instructions for pattern generation, needs only to be described in advance.

EFFECT OF THE INVENTION

As described above, according to the present invention, in the case of supplying pattern signals of different properties to common pins, a desired one of pattern select signals set in plural registers is selected by the multiplexer 12F and the thus selected pattern select signal is used to control the multiplexer 12G to select a required one of the pattern signals—this allows ease in the preparation of the instruction program for pattern generation.

It will be apparent that many modifications and variations may be effected without departing from the scope of the novel concepts of the present invention.

What is claimed:

1. A memory testing device which tests a memory by applying a pattern to its plural input/output pins, said device comprising:

a pattern generator for generating pattern data of each of address, data and command signals and a register selection control signal;

a pattern selector for selecting a piece of pattern data corresponding to each of said plural input/output pins of said memory under test, from said pattern data output from said pattern generator;

a formatter for converting said pattern data selected by said pattern selector into a pattern of a desired real waveform; and a driver for applying said pattern from said formatter to said input/output pins corresponding thereto;

wherein said pattern selector comprises:

plural pattern selection control signal registers each provided corresponding to at least the kinds of said signals, for storing pattern selection control signals for selecting the pattern data that is output from said pattern generator;

a control signal select multiplexer responsive to said register selection control signal from said pattern generator to select and output one of said pattern selection control signals from said pattern selection control signal registers; and a pattern select multiplexer responsive to said selected pattern selection control signal to select said pattern data from said pattern generator and provide it to said formatter.

2. The device of claim 1, wherein said plural pattern selection control signal registers comprise a command register for storing a control signal that is used to select pattern data corresponding to said command signal, plural address registers for storing control signals that are used to select pattern data corresponding to plural address signals, and a data register for storing a control signal that is used to select pattern data corresponding to said data signal.

3. The device of claim 1, wherein said pattern generator comprises: a sequence control part for controlling a pattern generating sequence; an instruction memory wherein an address calculation instruction necessary for the generation of pattern data, data and said register selection control signal are described as a program; and an address calculation part responsive to an address calculation instruction from said instruction memory to calculate an address and generate pattern data of said address.

* * * * *